United States Patent [19]

Kobayashi et al.

[11] 4,345,172
[45] Aug. 17, 1982

[54] OUTPUT CIRCUIT

[75] Inventors: Satoru Kobayashi; Hiroshi Watanabe, both of Tokyo, Japan

[73] Assignee: Nippon Electric Co., Ltd., Tokyo, Japan

[21] Appl. No.: 93,263

[22] Filed: Nov. 13, 1979

[30] Foreign Application Priority Data

Nov. 14, 1978 [JP] Japan ............................... 53-140352

[51] Int. Cl.³ ..................... H03K 5/08; H03K 19/092; H03K 19/094; H03K 19/017
[52] U.S. Cl. ................................... 307/562; 307/448; 307/473; 307/475; 307/482; 307/568
[58] Field of Search ............... 307/270, 443, 446, 448, 307/453, 475, 481, 482, 548, 550, 555, 558, 562, 568, 575, 577, 578, 584, 473

[56] References Cited

U.S. PATENT DOCUMENTS

| | | | |
|---|---|---|---|
| 3,648,071 | 3/1972 | Mrazek | 307/562 X |
| 3,774,053 | 11/1973 | Carlson | 307/558 X |
| 3,906,255 | 9/1975 | Mensch, Jr. | 307/473 X |
| 4,023,050 | 5/1977 | Fox et al. | 307/475 X |
| 4,096,398 | 6/1978 | Khaitan | 307/562 X |
| 4,129,793 | 12/1978 | Bula et al. | 307/577 X |
| 4,275,313 | 6/1981 | Boll et al. | 307/562 X |

*Primary Examiner*—Larry N. Anagnos
*Attorney, Agent, or Firm*—Laff, Whitesel, Conte & Saret

[57] ABSTRACT

An output circuit provided with level compatibility is disclosed. The circuit comprises a logic means responsive to at least one input signal for producing an output signal, the logic means including a first and a second power nodes, a first power source, a variable resistor means coupled between the first power node and the first power source and a control means responsive to the output signal for controlling the variable resistor means so as to limit a high level of the output signal in absolute value.

16 Claims, 9 Drawing Figures

OUTPUT CIRCUIT

BACKGROUND OF THE INVENTION

This invention relates to an output circuit employing insulated-gate field-effect transistors, and more particularly to an output circuit fabricated in a form of a semiconductor integrated circuit.

Recently, a demand has arisen for integrating more semiconductor devices on a semiconductor chip having a limited area to fabricate a large scale integrated circuit (LSI) employing insulated-gate field-effect transistors (hereinafter referred to as IGFETs) such as MOS(metal-oxide-semiconductor) transistors. Attempts have thus been made to shorten the lengths of the channels of IGFETs on the chip, thereby increasing their effective integrating density and offering an IGFET configuration that makes most use of the physical properties of the semiconductor.

In general, as the channel length of an IGFET decreases, the breakdown voltage across drain and source drops appreciably. Therefore, efficient use of the characteristics of an IGFET become impossible with a power voltage of 12 volts which is most commonly employed to operate an integrated circuit composed of IGFETs. As a result, the integrated circuit must be modified to operate by a lower supply voltage. In addition, an integrated circuit of this type requires an input-/output level compatibility with TTL and is invariably supplied from a 5-volt power supply. This increases the complexity of the power supply as well as the use of a $-5$ volt supply for biasing the semiconductor substrate. Namely, the circuit requires 12-volt, $+5$ volt and $-5$ volt power supplies. To reduce the number of power supplies used would render the design of an integrated circuit (such as a memory) far simpler than is realized today. To be more specific, a conventional integrated circuit requiring three power supplies uses an output circuit that operates with 5 volts, for ensuring the TTL level compatibility. Accordingly, an elimination of this 5-volt supply is expected to reduce appreciably the complexity in the designing of an integrated circuit. However, an elimination of the power source only for the output circuit that assures the TTL level compatibility inevitably requires the use of another power supply other than the 5-volt power supply for the output circuit. Such other power supply may possibly fail to assure a maximum voltage (usually less than 5.5 volts) at a high logical level of the output circuit.

Therefore, one object of this invention is to provide an output circuit with a decreased number of power supplies in which the complexity in the power system is reduced.

Another object of this invention is to provide an output circuit which assures a logical high output level not to exceed the maximum level of the TTL logical high level.

According to the present invention, there is provided an output circuit comprising a series circuit responsive to at least one input signal for producing an output signal, the series circuit including first and second field-effect transistors connected in series between first and second nodes, a first power source, a third field-effect transistor coupled between the first node and the first power source, and control means responsive to the output signal for controlling the third transistor to limit the high level of the output signal in the absolute value.

The control means may be composed of a fourth field-effect transistor coupled between the first power source and the gate of the third transistor and a fifth transistor having a drain coupled to the gate of the third transistor, a source supplied with a second power source and a gate supplied with the output signal.

Such an output circuit may be so modified that it includes a sixth transistor having a drain connected to the source of the fifth transistor to which the voltage variation in the output signal is fed back, which controls the conductance of the third transistor, the gate driven by a timing signal, and the source supplied with the second power source. By means of such modification, a deviation in the output signal is fed back to the gate of the fifth transistor to increase the voltage at the gate of the fifth transistor for clamping at the output signal.

Another modification of the output circuit is such that it includes a sixth transistor having its drain connected to the source of the fifth transistor back. The gate is connected to the drain of the fifth transistor, and to the source supplied with the second power source.

According to still another modification, the output circuit further includes a sixth transistor having a drain and a gate commonly connected to the source of the fifth transistor and a source supplied with the second power source, wherein the voltage at the gate of the fifth transistor can be increased.

Other objects and advantages of this invention will be apparent by the following description in conjunction with the accompanying drawings, in which.

In the following description, IGFETs are assumed to be N-channel MOSTs which provide a logical 1 level with high level and a logical 0 level with low level, but the description thereof similarly applies to P-channel MOSTs without any modification.

Figure 1:
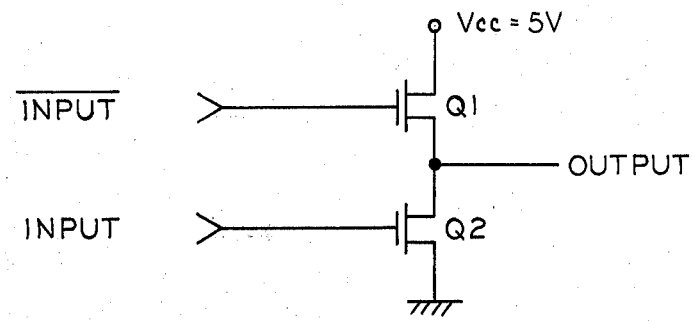
FIG. 1 is a circuit diagram showing an output circuit capable of assuring a TTL level, according to the conventional integrated circuit employing three power supplies.

With reference to FIG. 1, a conventional circuit for assuring TTL level compatibility will be described. Gates of serially connected transistors $Q_1$ and $Q_2$, in a totem pole manner, are supplied with an MOS level of true and complement signals INPUT and $\overline{\text{INPUT}}$, from a data amplifier (not shown), respectively. The transistors $Q_1$ and $Q_2$ are turned on or off depending on the true and complement signals. The drain of the transistor $Q_1$ is supplied with a power supply voltage $V_{cc}$ which is 5 volts. Now assume that the signal $\overline{\text{INPUT}}$ is, logical high MOS level and the signal INPUT terminal with a logical low level from the data amplifier. Then, the transistor $Q_1$ is turned on and the transistor $Q_2$ is turned off to produce a logical high level at OUTPUT terminal. In this case, the transistor $Q_1$ has physical characteristics such that it operates in the unsaturated region to permit a transient response which is quicker than the response in the saturated region. As a result, an integrated circuit having a 12-volt power source uses a logical high MOS level which is usually the level of $V_{DD}$ or $V_{DD}$ minus $V_T$ ($V_T$ is a threshold value of IGFET), and produces a logical high level (which is the level of $V_{CC}$) at the output terminal.

Therefore, if an allowance, for the deviation in voltage (which is usually within ±10%), is taken into consideration, an output circuit using a 5-volt power source provides the output node with a maximum of 5.5 volts in quiescent state. The output level in the case where a given load is connected to the output node will decrease depending upon the impedance of the load and the conductance of the conducting transistor $Q_1$. If the 5-volt power source used only for the output circuit is replaced by another power supply which is higher than the 5-volt power source, the power source for the output circuit is common with another power source for the output circuit, i.e. the $V_{DD}$ power source. Hence, a voltage level equal to $V_{DD}$ minus $V_T$ directly appears at the output node in a static state. Now it is assumed that the $V_{DD}$ level is 7 volts and has the deviation of the voltage within ±10%, and that a threshold value ($V_T$) for MOST is 1 volt. Then, a maximum output level is 6.7 volts (7.7−1.0). This is not a level to assume the TTL level compatibility. Therefore, the circuit configuration of FIG. 1 has failed to fully assure a logical high output level by such an increased power voltage.

Figure 2:
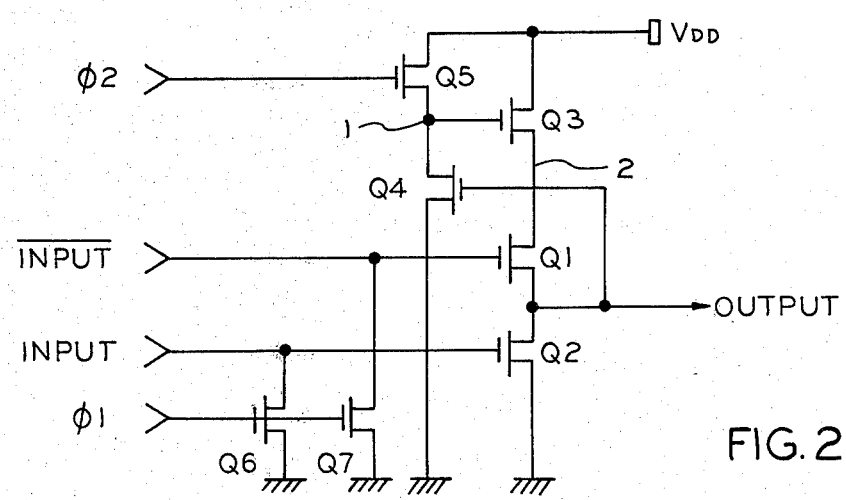
FIG. 2 is a circuit diagram showing an output circuit according to the first embodiment of this invention.

Now, with reference to FIGS. 2 and 3, a first preferred embodiment of the present invention will be described. In FIG. 2, transistors $Q_1$ and $Q_2$ are connected in series to form an output level converter circuit of a totem pole type. A transistor $Q_3$ is provided for selectively supplying power source ($V_{DD}$) to a drain of the transistor $Q_1$. A transistor $Q_4$ receives the output level derived from an output node OUTPUT at its gate. A transistor $Q_5$ receives a timing signal $\phi_2$ at its gate to selectively charge a node 1. Transistors $Q_6$ and $Q_7$ have the additional function of turning both transistors $Q_1$ and $Q_2$ off simultaneously in response to high level of a timing signal $\phi_1$, to make the impedance of the output node high. In the circuit of FIG. 2, the transistor $Q_3$ operates as a variable resistor controlled by a level of the node 1 so as to control the value of high level at the output node OUTPUT. The transistors $Q_4$ and $Q_5$ respond to the output node OUTPUT to control the level of the node 1 in a manner of an inverter. Thus, the transistors $Q_3$, $Q_4$ and $Q_5$ cooperatively limit the value of the high level at the output node OUTPUT.

Figure 3:
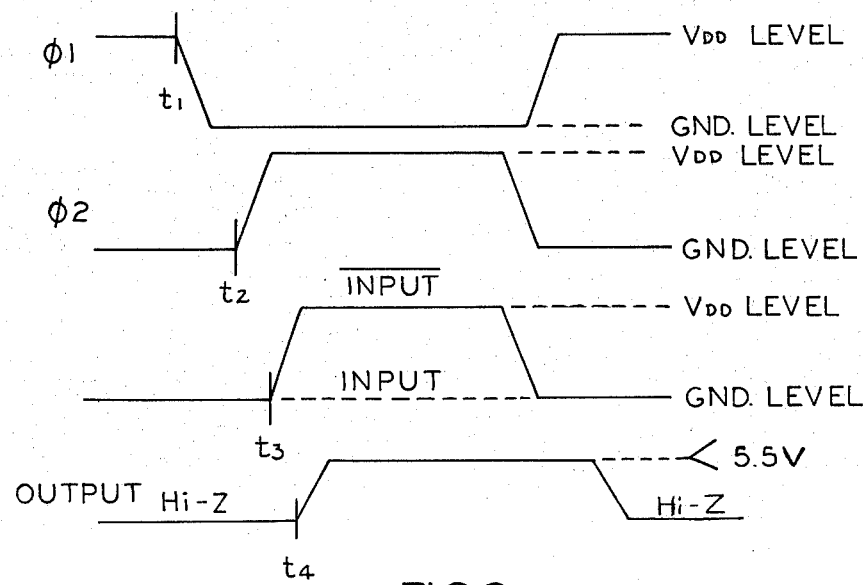
FIG. 3 is a waveform diagram illustrating the operation of the circuit of FIG. 2.

With reference to FIG. 3, an operation of the circuit will be described. In this case, the output circuit receives true and complement signals INPUT and $\overline{\text{INPUT}}$ derived from a data amplifier (not shown) for reading out memory cells in a semiconductor memory (hereinafter referred to as a "memory"). At a time point $t_1$, the timing signal $\phi_1$ changes from a high level to a low level to switch off the transistors $Q_6$ and $Q_7$ to make the signals $\overline{\text{INPUT}}$ and INPUT valid for the circuit. Then, at a time point $t_2$, the timing signal $\phi_2$ changes from the low level to the high level to enable the circuit by conducting the transistor $Q_5$. The conducting transistor $Q_5$ charges the node 1 to switch on the transistor $Q_3$. At a time point $t_3$, the complement signal $\overline{\text{INPUT}}$ becomes high level while the true signal INPUT remains low level. These states of the signals switch the transistors $Q_1$ and $Q_2$ ON and OFF respectively.

As a result, from a time point $t_4$, the voltage of the output node OUTPUT starts to increase. Then, the level at the output node OUTPUT exceeds the threshold value $V_T$, the transistor $Q_4$ starts to conduct gradually to decrease the level at the node 1. If the transistor $Q_4$ is not existed and the $V_{DD}$ level is set at a specific value higher than 5 volts, the node 1 is charged at a level of $V_{DD}$ minus the threshold value $V_T$ and the node 2 is held at a level of $V_{DD}$ minus twice the threshold value $V_T$. On the other hand, in this case, as the level at the output node OUTPUT simply increases with the increase in the INPUT level until it exceeds $V_T$ (the threshold value for transistor $Q_4$), the transistor $Q_4$ conducts to lower the level at the node 1. Here, it is obvious from the physical characteristics of a MOST that by selecting a specific value for the conductance ratio of transistor $Q_4$ to $Q_5$, the level at node 1 can be set at a desired value. Therefore, for the level at the output node OUTPUT which is required to be set at lower than 5.5 volts, the node 1 is required to be maintained at a level lower than 5.5 volts plus the threshold value $V_T$ of the transistor $Q_3$, which level can readily be established by selecting a suitable value for the conductance ratio of the transistor $Q_4$ to $Q_5$. This is possible with any value of $V_{DD}$. As described in the foregoing, the circuit of this invention has the capability of clamping the output level and the output level compatibility. It should be noted that the transistors $Q_6$ and $Q_7$ are not essential to be present invention.

The second preferred embodiment of the output circuit of this invention is now described with reference to FIGS. 4 and 5. The circuit configuration comprising transistors $Q_1$ to $Q_7$ are the same as in the embodiment of FIG. 2. The circuit of FIG. 4 controls the gate of the transistor $Q_5$ by means of a bootstrap circuit including transistors $Q_8$ to $Q_{10}$ and a capacitor $C_B$. The circuit also includes a transistor $Q_{12}$ having the gate supplied with the signal INPUT, the drain supplied with the signal to $\overline{\text{INPUT}}$, and the source coupled to ground potential and a transistor $Q_{11}$ having the gate supplied with the signal $\overline{\text{INPUT}}$ the drain supplied with the signal INPUT, and the source coupled to the ground. The transistors $Q_{11}$ and $Q_{12}$ suppress the noise occurring at $\overline{\text{INPUT}}$ and INPUT lines so that the low level at the input lines is clamped to the ground level.

Figure 4:
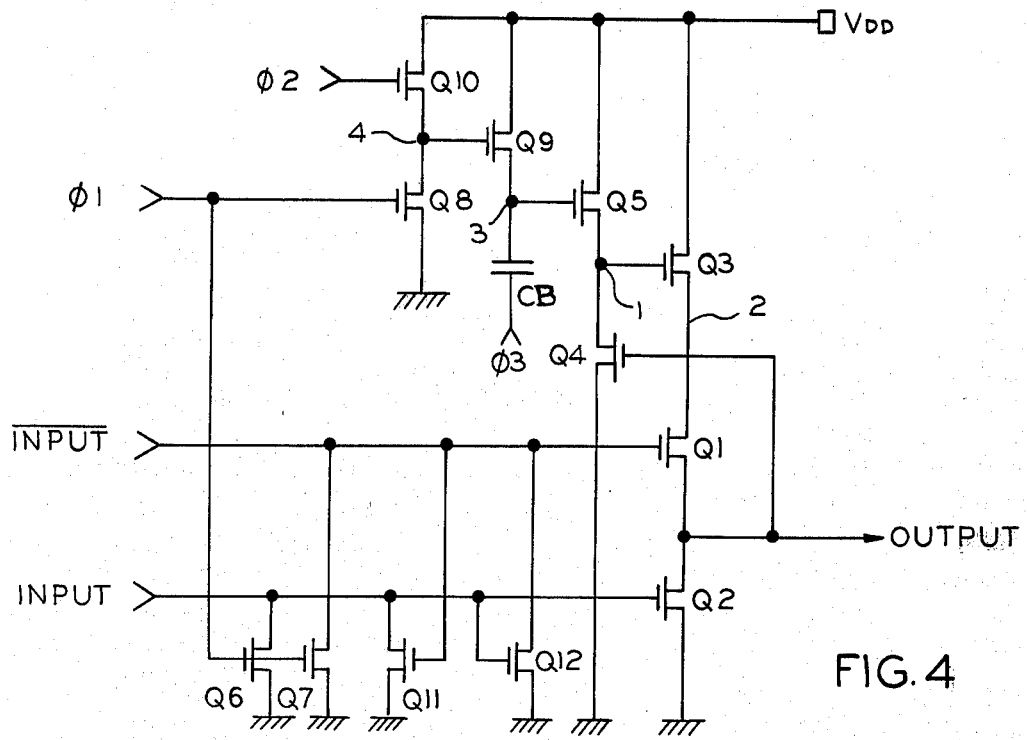
FIG. 4 is a circuit diagram showing an output circuit according to the second embodiment of this invention.
Figure 5:
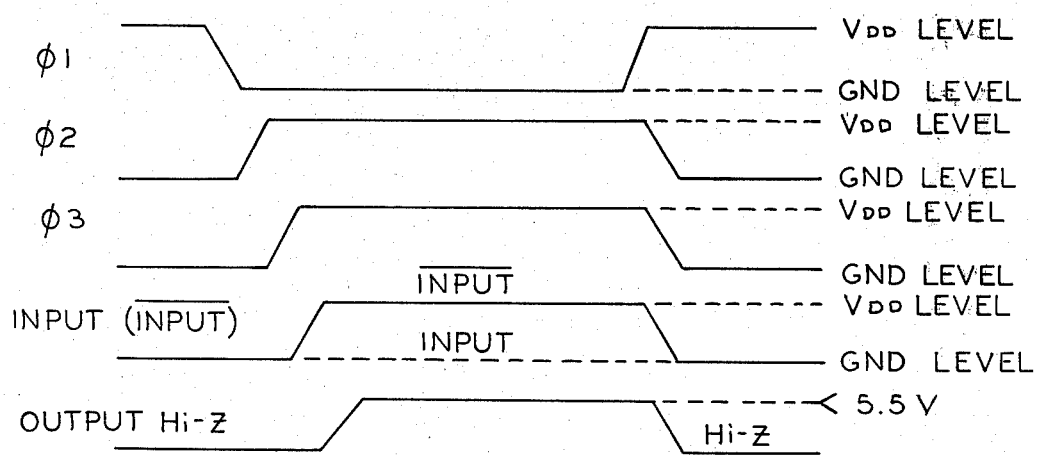
FIG. 5 is a waveform diagram illustrating the operation of the circuit of FIG. 4.

The operation of the circuit of FIG. 4 is illustrated in FIG. 5. When signal $\phi_1$ is at a high level, the transistors $Q_8$, $Q_6$ and $Q_7$ conduct, and node 4, input signals INPUT and $\overline{\text{INPUT}}$ are held substantially at the ground level. Subsequently, the timing signal $\phi_1$ falls and the signal $\phi_2$ reaches a high level. The transistor $Q_{10}$ conducts to charge the node 4 at a level of $V_{DD}$ minus $V_T$, to switch on transistor $Q_6$. Then, a little behind signal $\phi_2$, a timing signal $\phi_3$ rises to bring a node 3 to a level higher than the level of $V_{DD}$. Transistor $Q_5$ conducts to develop the level of $V_{DD}$ at the node 1. At the same time, the transistor $Q_3$ starts to conduct so that the node 2 is brought to a level of $V_{DD}$ minus $V_T$. The true and the complement signals INPUT and $\overline{\text{INPUT}}$ are also made valid. If the complement signal $\overline{\text{INPUT}}$ is at a high level, the transistor $Q_1$ conducts to produce a high-level output at the output node OUTPUT. The level of the output node is fed back to the gate of the transistor $Q_4$ to allow transistor $Q_4$ to conduct. As a result, the gate voltage of the transistor $Q_3$ is decreased from $V_{DD}$ to a level determined by the conductance ratio of transistor $Q_5$ to $Q_4$, to produce the conductance of transistor $Q_3$. In consequence, the logical high output at the output node OUTPUT is decreased to an equilibrium which is determined by the conductances of transistors $Q_4$ and $Q_5$, to produce an output lower than the level of $V_{DD}$.

Figure 6:
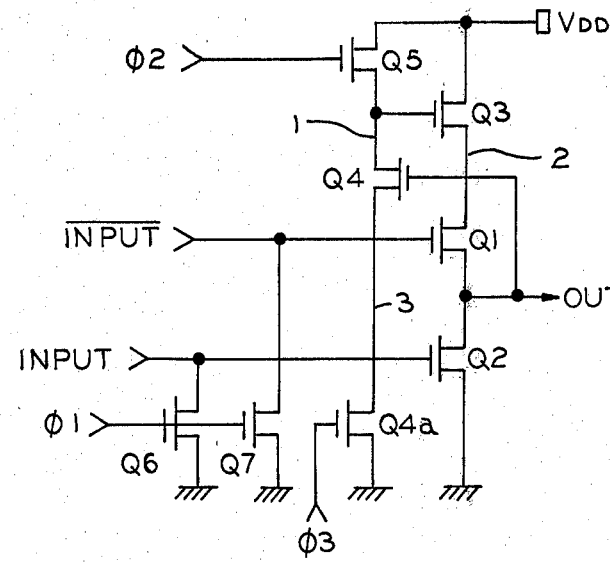
FIGS. 6 to 9 are circuit diagrams showing output circuits according to the third to sixth embodiments of this invention, respectively.

The third to sixth embodiments of this invention will be described by reference to FIGS. 6 to 9. The third embodiment of this invention is shown in FIG. 6 which is the same as the configuration of FIG. 2 except that the source of transistor $Q_4$ is grounded through transistor $Q_{4a}$, the gate of which is supplied with signal $\phi_3$ which may be of the type illustrated in FIG. 5. In the embodiment shown, the gate voltage for transistor $Q_3$ is determined by the conductance ratio of transistors $Q_5$, $Q_4$ and $Q_{4a}$, and the degree of the freedom of the ratio can be substantially increased by insertion of the transistor $Q_{4a}$. Therefore, the embodiment of FIG. 6 has the advantage of obviating a strict control of the configuration of transistor $Q_4$.

Figure 7:
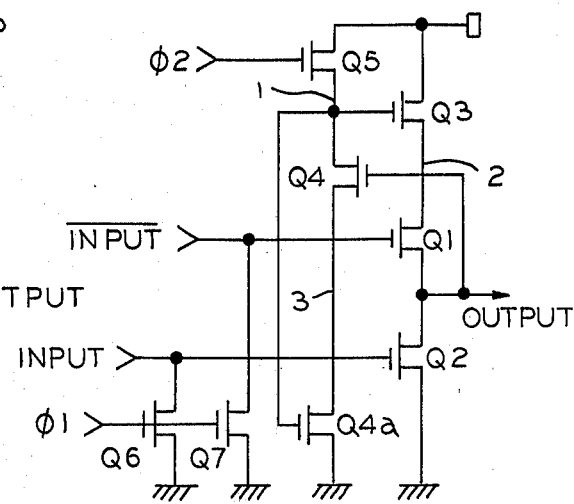

The fourth embodiment of this invention is now described with reference to FIG. 7 which provides the same advantage as FIG. 6 by employing the same circuit configuration except that, instead of supplying the gate of transistor $Q_{4a}$ with signal $\phi_3$, the gate is directly connected to the node 1.

Figure 8:
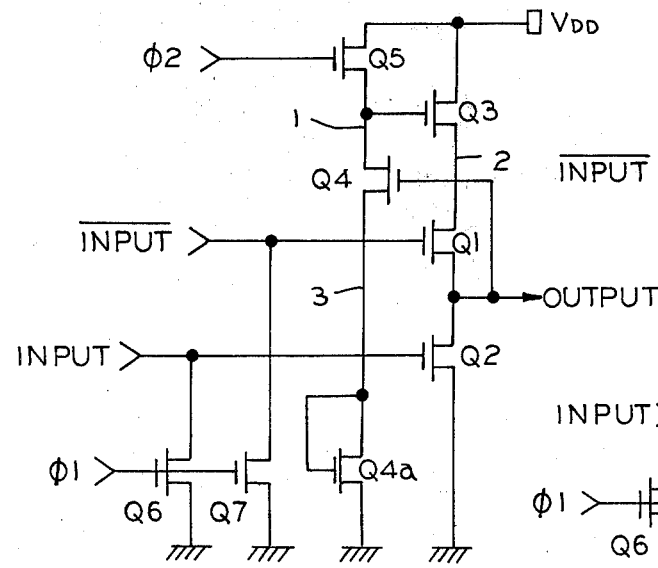

The fifth embodiment of this invention is described with reference to FIG. 8 which provides a smaller conductance for transistor $Q_{4a}$ than in FIG. 7 by connecting the gate of transistor $Q_{4a}$ to the drain thereof, namely the conjunction between the transistors $Q_4$ and $Q_{4a}$. Therefore, the embodiment of FIG. 8 differs from that of FIG. 7 in that the supply of gate voltage to the transistor $Q_{4a}$ is shifted by one stage of the threshold value to decrease the conductance of the transistor. The result is an increased degree of design freedom for an integrated circuit such as a memory circuit.

Figure 9:
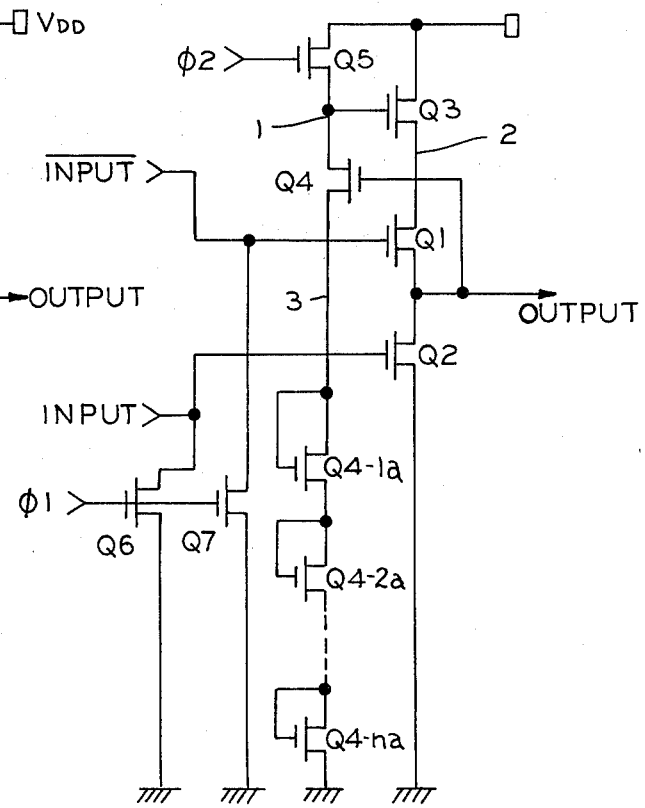

The sixth embodiment of this invention will be described with reference to FIG. 9 wherein the source of transistor $Q_4$ is grounded through n stages of transistors $Q_{4-1a}$ to $Q_{4-na}$ connected in series, and each having commonly connected gate and drain. This embodiment is advantageous in that it provides an appreciably low conductance between node 1 and the ground to achieve a significant decrease in the gate voltage for transistor $Q_3$.

While this invention has been described herein by reference to the embodiments shown in FIGS. 2 to 9, it should be understood that the invention can employ other basic circuits and that embodiments including such modifications can be readily implemented to expand the scope of application of the invention. The reproduction of such other embodiments will add to the improvement provided by this invention in that it is capable of freely varying the level at which the output node voltage is fed back to control the conductance of a line voltage supplying transistor to make a transition from a low level of output node voltage to a high level without prejudice to the fundamental operating principle of the invention.

As described in the foregoing, the advantage of this invention is noteworthy in that, even if the level of $V_{DD}$ is considerably higher than the specified output voltage, it is capable of setting a high output level at a level that assures TTL level compatibility by properly selecting the ratio of the transistors $Q_4$ and $Q_5$ as well as the size of transistor $Q_{4a}$. One practical merit of such an advantage is that a semiconductor integrated circuit which has conventionally been operated on three power supplies can be operated on two supplies. In case that P channel field-effect transistors are employed in the circuit, it is apparent that a lower level of negative value is treated as a high level of the output signal in absolute value.

What is claimed is:

1. An output circuit comprising a series circuit including first and second field-effect transistors connected in series between first and second nodes and an output node derived from a junction between said first and second transistors, said first and second transistors being controlled by at least one signal, a first power source, a third field-effect transistor provided between said first node and said first power source, and a control means responsive to a level of said output node for controlling a level at the gate electrode of said third transistor so as to limit a high level of said output in absolute value.

2. The circuit according to claim 1, wherein said control means includes a load element coupled between said first power source and the gate of said third transistor and a fourth field-effect transistor having a drain coupled to the gate of said third transistor, a gate supplied with a signal from said output node and a source coupled to a second power source.

3. The circuit according to claim 2, wherein said load element includes a fifth field-effect transistor inserted between said first power source and the gate of said third transistor.

4. The circuit according to claim 2, wherein said control means further includes a voltage shift means inserted between the source of said fourth transistor and said second power source.

5. The circuit according to claim 1, wherein said first and second transistors receive true and complement signals at their gates respectively.

6. The circuit according to claim 5, further including a first means for operatively setting a level of the gate of said first transistor at a predetermined level and a second means for operatively setting a level of the gate of said second transistor at said predetermined level.

7. The circuit according to claim 4, further including a third means responsive to the level of the gate of said first transistor for setting the gate of said second transistor at said predetermined level and a fourth means responsive to the level of the gate of said second transistor for setting the gate of said first transistor at said predetermined level.

8. An output circuit comprising a logic means responsive to at least one input signal for producing an output signal, said logic means including first and second power nodes, a first power source, a variable resistor means coupled between said first power node and said first power source, and control means electrically isolated from said input signal per se, said control means responsive only to said output signal for controlling said variable resistor means so as to limit a high level of said output signal in absolute value.

9. The circuit according to claim 8, wherein said variable resistor means includes a first field-effect transistor coupled between said first power source and said first power node.

10. The circuit according to claim 9, wherein said control means includes a load element coupled between said first power source and a gate of said first transistor and a second field-effect transistor having a drain coupled to the gate of said first transistor, a gate supplied with said output signal and a source supplied with a second power source.

11. An output circuit comprising a logic means responsive to at least one input signal for producing an output signal, said logic means including first and second power nodes, first power source means, variable resistor means including a first field-effect transistor coupled between said first power node and said first power source means, control means electrically isolated from said input signal per se, said control means being responsive only to said output signal for controlling said variable resistor means to limit a high level of said output signal in absolute value, said control means further including a load element coupled between said first power source and a gate of said first transistor and a second field-effect transistor having a drain coupled to the gate of said first transistor, a gate supplied with said output signal and a source supplied with a second power source, said logic means further including a third field-effect transistor having a true input signal at its gate and a fourth field-effect transistor having a complement input signal at its gate connected in series between said first and second power nodes, said output signal signal being derived from a common junction between said third and fourth transistors.

12. An output circuit comprising a first voltage terminal, a second voltage terminal, an output terminal, first to third nodes, a first field effect transistor coupled between said first voltage terminal and said first node and having a gate electrode coupled to said third node, a second field effect transistor coupled between said first node and said second node, a third field effect transistor coupled between said second node and said second voltage terminal, a fourth field effect transistor coupled between said first voltage terminal and said third node, a fifth field effect transistor having a drain coupled to said third node and a gate coupled to said second node, a first circuit connection coupled between a source of said fifth field effect transistor and said second voltage terminal, a second circuit connection for connecting said second node to said output terminal, and signal means responsive to at least one logic signal for controlling said second and third field effect transistors.

13. The circuit according to claim 12, further comprising a sixth field effect transistor having a drain coupled to a gate of said second field effect transistor, a gate coupled to a gate of said third field effect transistor and a source coupled to said second voltage terminal, and a seventh field effect transistor having a drain coupled to the gate of said third field effect transistor, a gate coupled to the gate of said second field effect transistor and a source coupled to said second voltage terminal.

14. The circuit according to claim 12, in which said first circuit connection includes means for shifting a voltage thereacross.

15. The circuit according to claim 12, further comprising a capacitor having a first terminal coupled to said third node and means for supplying a second terminal of said capacitor with a control signal.

16. The circuit according to claim 12, in which said signal means includes a first gate wiring for supplying the gate of said third field effect transistor with a first logic signal and a second gate wiring for supplying the gate of said second field effect transistor with a second logic signal having a phase which is opposite to the phase of said first logic signal.

* * * * *